United States Patent [19]
Chien

[11] Patent Number: 6,153,516
[45] Date of Patent: Nov. 28, 2000

[54] METHOD OF FABRICATING A MODIFIED POLYSILICON PLUG STRUCTURE

[75] Inventor: Ho-Ching Chien, Hsinchu, Taiwan

[73] Assignee: Vanguard International Semiconductor Corporation, Hsin-Chu, Taiwan

[21] Appl. No.: 09/151,155

[22] Filed: Sep. 10, 1998

[51] Int. Cl.[7] .............................................. H01L 21/4763
[52] U.S. Cl. ........................ 438/647; 438/453; 438/547; 438/598; 438/618
[58] Field of Search .................................... 438/253, 396, 438/306, 307, 308, 309, 453, 597, 598, 618, 647

[56] References Cited

U.S. PATENT DOCUMENTS

| | | | |
|---|---|---|---|
| 5,082,801 | 1/1992 | Nagata | 437/190 |
| 5,444,020 | 8/1995 | Lee et al. | 437/195 |
| 5,502,006 | 3/1996 | Kasagi | 437/195 |
| 5,529,953 | 6/1996 | Shoda | 437/189 |
| 5,552,343 | 9/1996 | Hsu | 437/195 |
| 6,017,813 | 1/2000 | Kuo | 438/618 |
| 6,025,227 | 2/2000 | Sung | 438/253 |

*Primary Examiner*—David Nelms
*Assistant Examiner*—Reneé R Berry
*Attorney, Agent, or Firm*—George O. Saile; Stephen B. Ackerman

[57] ABSTRACT

A process for forming a modified polysilicon plug structure, used to connect a bit line structure, of a semiconductor memory device, to an underlying source and drain region, of a transfer gate transistor, has been developed. The process features the formation of a dual shaped opening in an insulator layer, comprised of a wide, upper opening, overlying a narrower, lower opening, which exposes the top surface of a source and drain region. Polysilicon deposition and patterning result in the formation of the modified polysilicon plug structure, comprised of a wide polysilicon trench shape, in the upper opening in the insulator layer, and an underlying, narrower polysilicon plug, in the lower opening, in the insulator layer, with the narrow polysilicon plug contacting the underlying source and drain region. An overlying bit line structure is formed, contacting the top surface of the underlying, polysilicon trench shape, exposed in a bit line via hole.

21 Claims, 9 Drawing Sheets

METHOD OF FABRICATING A MODIFIED POLYSILICON PLUG STRUCTURE

BACKGROUND OF THE INVENTION

(1) Field of the Invention

The present invention relates to a method used to fabricate semiconductor memory devices, and more specifically to a method used to create a polysilicon plug structure, used interconnect a bit line structure, to an underlying transfer gate transistor.

(2) Description of Prior Art

The trend to continually shrink dynamic random access memory, (DRAM), chips, necessitates the use of more sophisticated structures, used to connect overlying metal or polysilicon structures, such as bit lines, to underlying device components, such as source and drain regions of transfer gate transistors. One approach used by semiconductor designers and engineers is the use of a polysilicon plug structure, placed between bit line structures and underlying transfer gate transistor components. However the polysilicon plug, designed with minimum dimensions to satisfy the goal of micro-miniaturization, presents an alignment problem when attempting to place an overlying bit line structure on the top surface of an underlying polysilicon plug structure. One solution to the problem of placing a bit line structure, on a underlying polysilicon plug structure, is the addition of a landing pad shape, formed between the underlying polysilicon plug and the overlying bit line structure. The landing pad shape, larger in surface area than the polysilicon plug, allows an easier target for a subsequent overlying bit line structure, to contact. However the additional processing needed to create the landing pad shape, and the difficulty in aligning the landing pad shape to the smaller, underlying polysilicon plug shape, still suggest other needed solutions for bit line to transfer gate transistor connection.

This invention will offer a solution for successfully overlying a bit line structure to an underlying transfer gate transistor, via the formation of a modified polysilicon plug structure, featuring a two shaped polysilicon structure. The bottom shape of the modified polysilicon plug structure, is a narrow polysilicon plug, contacting an underlying source and drain region, of a transfer gate transistor. The upper shape of the modified polysilicon plug structure, is a polysilicon filled trench shape, larger in area than the underlying polysilicon plug, but created simultaneously with the smaller area, polysilicon plug, thus eliminating the need for the difficult alignment of the landing pad to the small area, underlying polysilicon plug structure. An important feature of this invention is the definition of the initial pattern of the trench, in an silicon oxide layer, via conventional photolithographic and anisotropic dry etching procedures, followed by an exposure to an isotropic wet etch, resulting in an enlargement of the trench. A second phase consists of defining the small opening in the silicon oxide layer, within the enlarged trench shape, needed to except the polysilicon plug structure. Polysilicon deposition and patterning, now result in the modified polysilicon plug structure, comprised of a polysilicon filled trench, overlying a narrower polysilicon plug. Prior art such as Hsu, in U.S. Pat. No. 5,552,343, describes a process for forming a tapered contact hole, via a wet etch, followed by a smaller hole, obtained via an anisotropic dry etch procedure. However this prior art does not use anisotropic dry etching for definition of both the larger and smaller diameter openings, nor does this prior art describe a method for creating the modified polysilicon plug structure, described in this invention.

SUMMARY OF THE INVENTION

It is an object of this invention to connect an overlying bit line structure, of a semiconductor memory device, to an underlying source and drain region of a transfers gate transistor, using a modified polysilicon plug structure.

It is another object of this invention to form the upper polysilicon shape, of the modified polysilicon plug structure, by polysilicon filling of a trench that is formed in the upper portion of a dielectric layer via patterning, including an anisotropic dry etching procedure, followed by an isotropic wet etching procedure, used to enlarge the trench.

It is still another object of this invention to form the bottom polysilicon shape, of the modified polysilicon plug structure, by forming a narrow opening in the lower portion of a dielectric layer, and filling with polysilicon, creating a narrow polysilicon plug, underlying the wider, trench filled, polysilicon shape.

In accordance with the present invention, a process is described for connecting an overlying bit line structure, of a semiconductor memory device, to a source and drain region of an underlying transfer gate transistor, via a modified polysilicon plug structure. A source and drain region, of a transfer gate transistor, is provided, located between polysilicon gate structures. A first insulator layer is deposited, and patterned, via conventional photolithographic and anisotropic dry etch procedures, to create a trench opening in the top portion of the first insulator layer, with the trench opening overlying the source and drain region, and extending to overlay an adjacent field oxide region. An isotropic wet etch is next used to increase the width of the trench opening, in the top portion of the first insulator layer. A narrow contact hole, in the bottom portion of the first insulator layer, in the enlarged trench, is formed, exposing the top portion of the source and drain region. A first polysilicon layer is deposited, completely filling the narrow contact hole, in the bottom portion of the first insulator layer, and completely filling the enlarged trench. Removal of first polysilicon layer, from the surface of the first insulator layer, results in the creation of the modified polysilicon plug structure, comprised of a narrow, underlying polysilicon plug, contacting the underlying source and drain region of the transfer gate transistor, and an upper polysilicon filled trench shape, contacting the underlying, narrow polysilicon plug, and with the upper polysilicon filled trench shape, extending to overlay an adjacent field oxide region. A second insulator layer is deposited, followed by the opening of a via hole on the second insulator layer, exposing the top surface of the upper polysilicon filled trench shape, in a region in which the upper polysilicon filled trench shape overlays a field oxide region. A second polysilicon layer, and a metal silicide layer, are next deposited, and patterned, to form a bit line structure, for the semiconductor memory device, contacting the modified polysilicon plug structure, at the bottom of the via hole.

BRIEF DESCRIPTION OF THE DRAWINGS

The object and other advantages of this invention are best described in the preferred embodiment with reference to the attached drawing s that include:

FIGS. 3A–5A, 7A, which schematically show top views of the modified polysilicon plug, at key stages of fabrication.

DESCRIPTION OF THE PREFERRED EMBODIMENTS

The method of forming a modified polysilicon plug structure, used to connect a bit line structure, of a semiconductor memory device, to an underlying source and drain region of a transfer gate transistor, will now be described in detail. The modified polysilicon plug, described in this invention, is applied to a memory device, such as a DRAM type device, using an N channel, metal oxide semiconductor field effect transistor, (MOSFET), device. However the modified polysilicon plug structure, described in this invention, can be applied to other memory type devices, such as SRAM, or BiCMOS type devices, and can also be applied to P channel, MOSFET devices.

Figure 1:
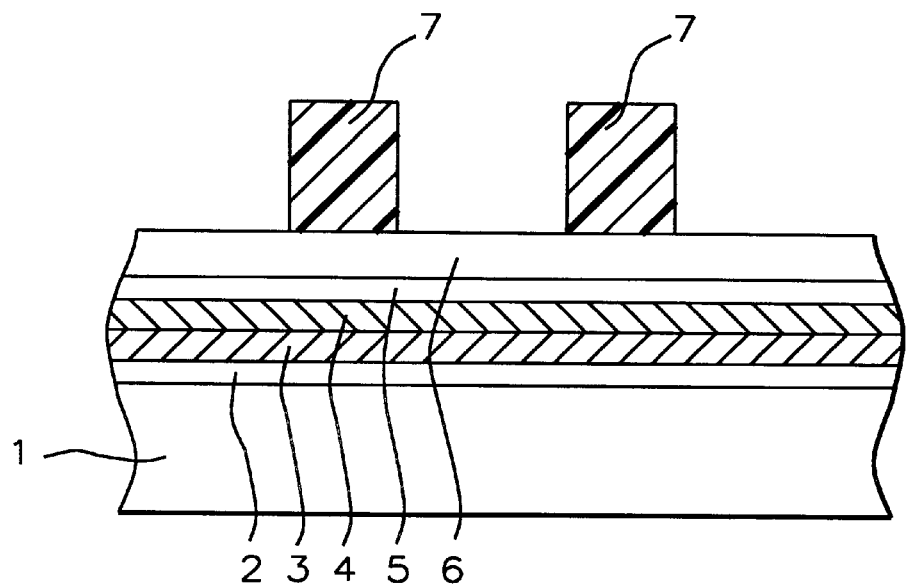
FIGS. 1, 2, 3B, 4B, 5B, 6A, 6B, 3C, 4C, 5C, 7C, 4D, 7B, schematically, in cross-sectional style, show the modified polysilicon plug structure, again at key stages of fabrication.

A P type, semiconductor substrate 1, comprised of single crystalline silicon, having a <100> crystallographic orientation, is used and shown schematically in FIG. 1. Field oxide regions 30, used for isolation purposes, are created via thermal oxidation of select portions of semiconductor substrate 1, to a thickness between about 2000 to 4000 Angstrom. FOX regions 30, are not shown in the cross-sectional schematic of FIG. 1b. A gate insulator layer 2, of silicon diocide, is thermally grown to a thickness between about 50 to 200 Angstroms, followed by the deposition of a polysilicon layer 3, at a thickness between about 500 to 1500 Angstroms, using a low pressure chemical vapor deposition, (LPCVD), procedure. Polysilicon layer 3, is doped using either an in situ doping procedure, via the addition of either arsine or phosphine, to silane ambient, or polysilicon layer 3, can be deposited intrinsically, then doped via implantation of either phosphorous or arsenic ions. A layer of tungsten silicide 4, is next deposited, again using LPCVD procedures, to a thickness between about 1000 to 1500 Angstroms, followed by the deposition of a thin silicon oxide layer 5, deposited using either LPCVD or plasma enhanced chemical vapor deposition, (PECVD), procedures, to a thickness between about 200 to 400 Angstroms, using tetraethylorthosilicate, (TEOS), as a source. Finally a layer of silicon nitride 6, is deposited, using LPCVD or PECVD procedures, to a thickness between about 1500 to 2500 Angstroms. The result of this series of depositions is shown schematically in FIG. 1.

Figure 2:
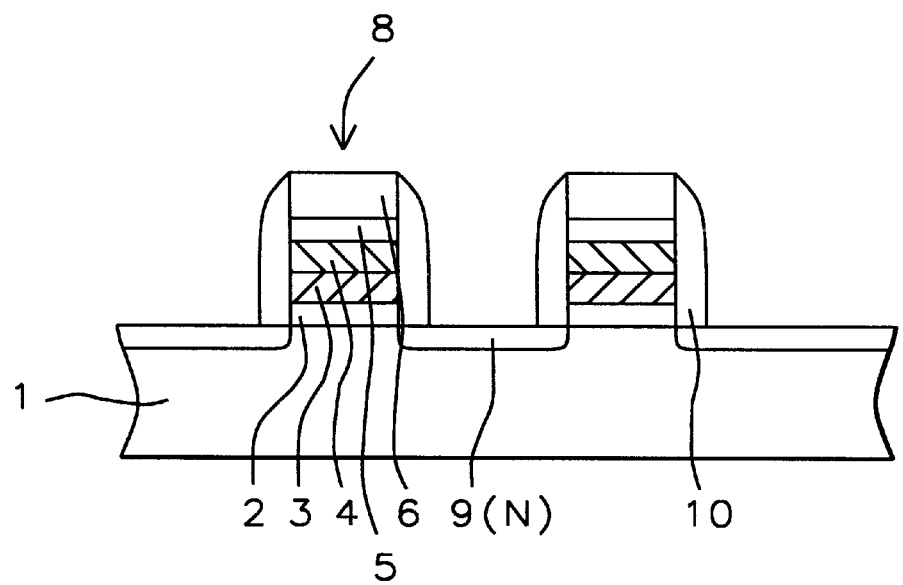
Figure 5A:
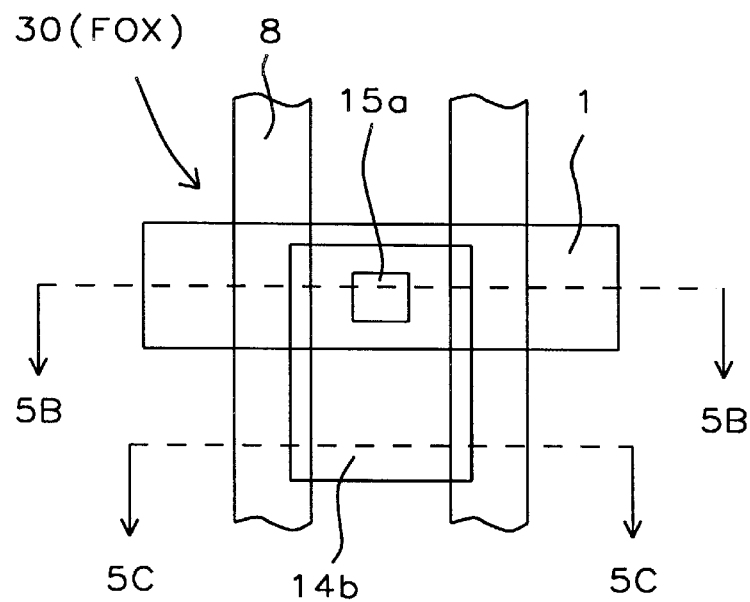
Figure 5B:
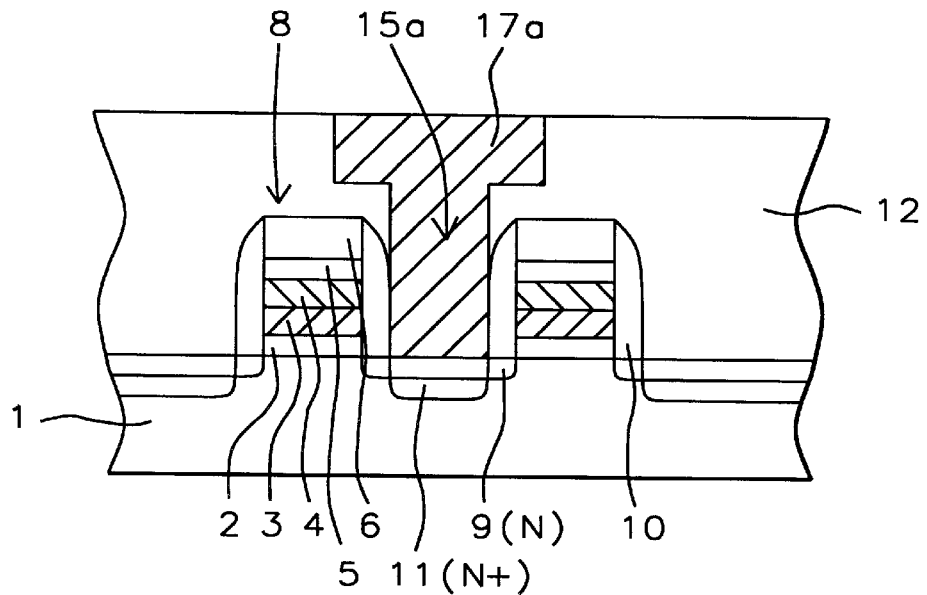

FIG. 2, schematically shows the creation of the transfer gate transistors, used in this invention. Conventional photolithographic and anisotropic reactive ion etching, (RIE), procedures, using photoresist shape 7, shown schematically in FIG. 1, as a mask, and using $CHF_3$ as an etchant for silicon nitride layer 6, and for silicon oxide layer 5, while using $Cl_2$ as an etchant for tungsten silicide layer 4, and for polysilicon layer 3, create polysilicon, or polycide gate structures 8, schematically displayed in FIG. 2. After removal of photoresist shape 7, used for polysilicon gate structure patterning, via plasma oxygen ashing, and careful wet cleans, a lightly doped source and drain region 9, is formed via ion implantation of phosphorous or arsenic. Silicon nitride spacers 10, are next formed, at a thickness between about 600 to 1200 Angstroms, via deposition of a silicon nitride layer using either LPCVD or PECVD procedures, followed by an anisotropic RIE procedure, using $CHF_3$ as an etchant. This is schematically shown in FIG. 2. A polysilicon plug structure, will subsequently be used in the cell array area. Phosphorous dopant, from the polysilicon plug, as a result of an anneal cycle, will provide the N+ dopant, from the overlying polysilicon plug structure, to an underlying region of the semiconductor substrate, creating a heavily doped source and drain region. This will be subsequently described in detail, and shown schematically in FIG. 5B.

Figure 3A:
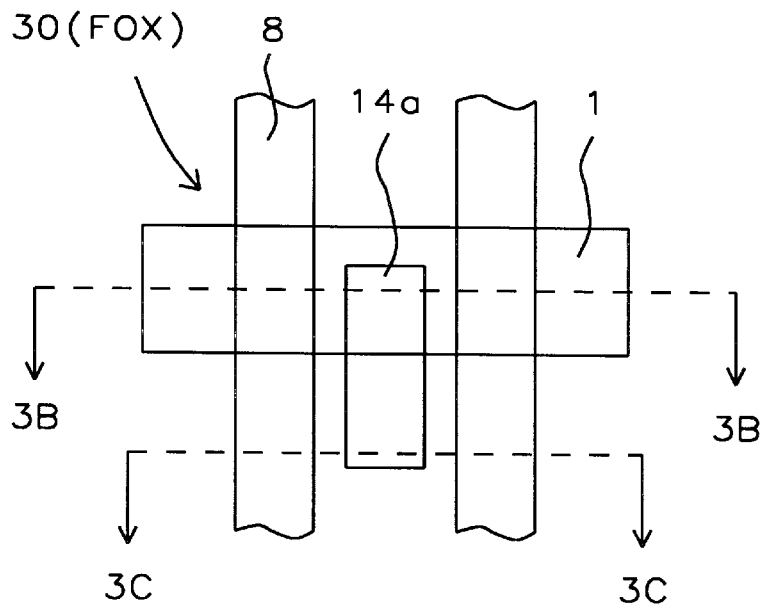
Figure 3B:
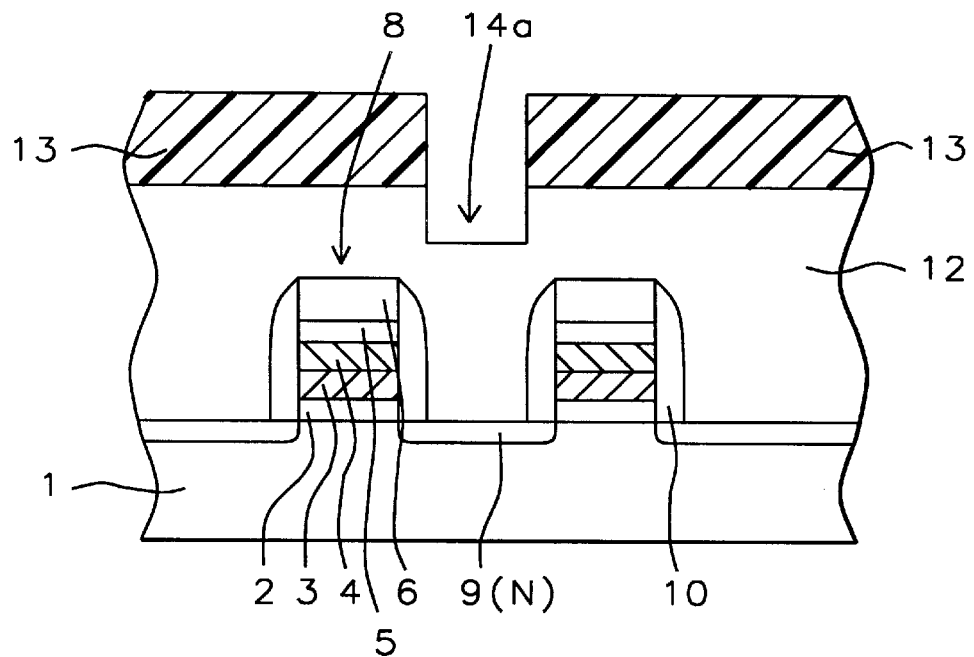
Figure 3C:
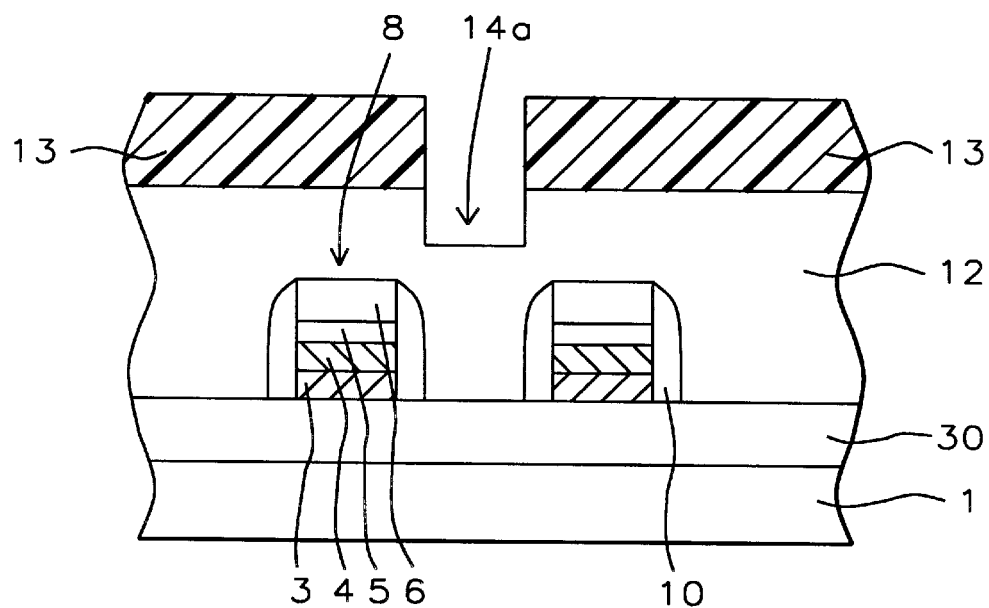

A first insulator layer 12, of silicon oxide, is deposited using LPCVD or PECVD procedures, to a thickness between about 8000 to 10000 Angstroms, followed by a planarizing, chemical mechanical polishing, (CMP), procedure, polished to a final thickness between about 3000 to 5000 Angstroms, resulting in a smooth top surface topography for first insulator layer 12. A second photoresist shape 13, with an opening 14a, is used to create opening 14a, in a top portion of first insulator layer 12, via an anisotropic RIE procedure, using $CHF_3$ as an etchant. The depth of opening 14a, in first insulator layer 12, is between about 2000 to 4000 Angstroms, with opening 14a, overlying an active region of semiconductor substrate 1, between polysilicon gate structures 8, schematically shown in cross-sectional style, in FIG. 3B, and extending to overlay a non-active region, between polysilicon gate structures 8, in a region in which polysilicon gate structures 8, reside on FOX region 30, shown schematically in cross-sectional style in FIG. 3C. FIG. 3A, schematically shows the top view of this structure.

Figure 4A:
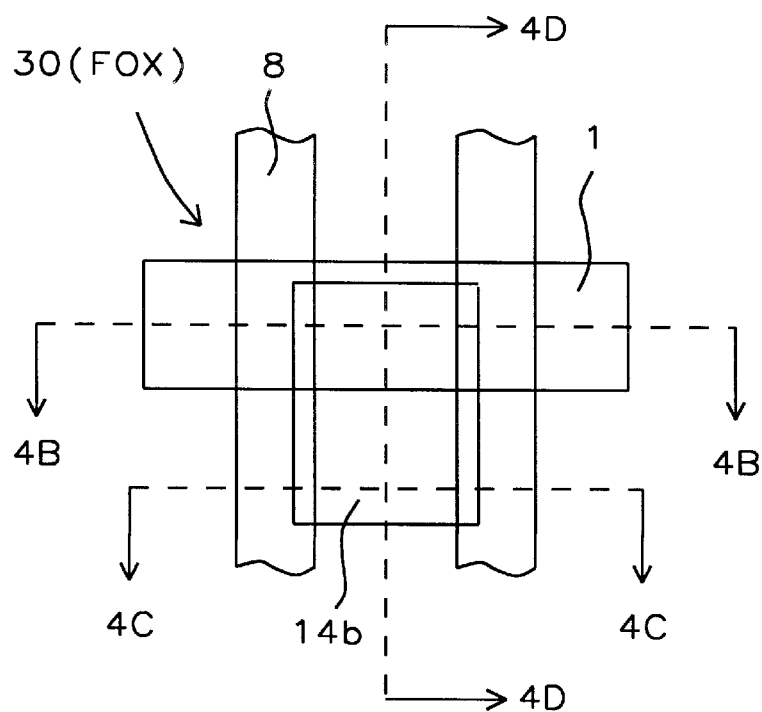
Figure 4B:
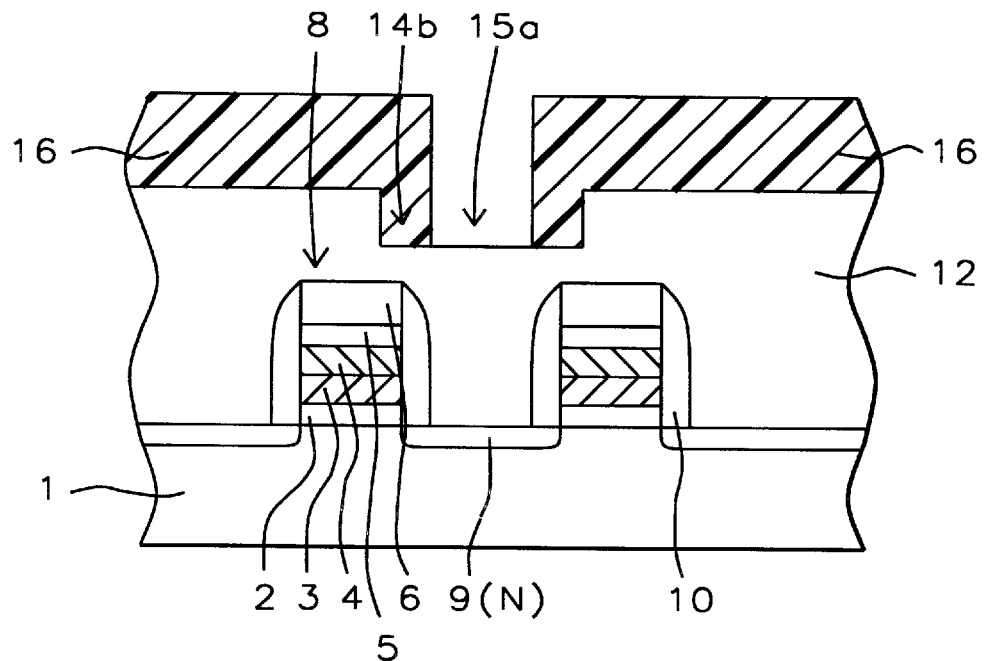
Figure 4C:
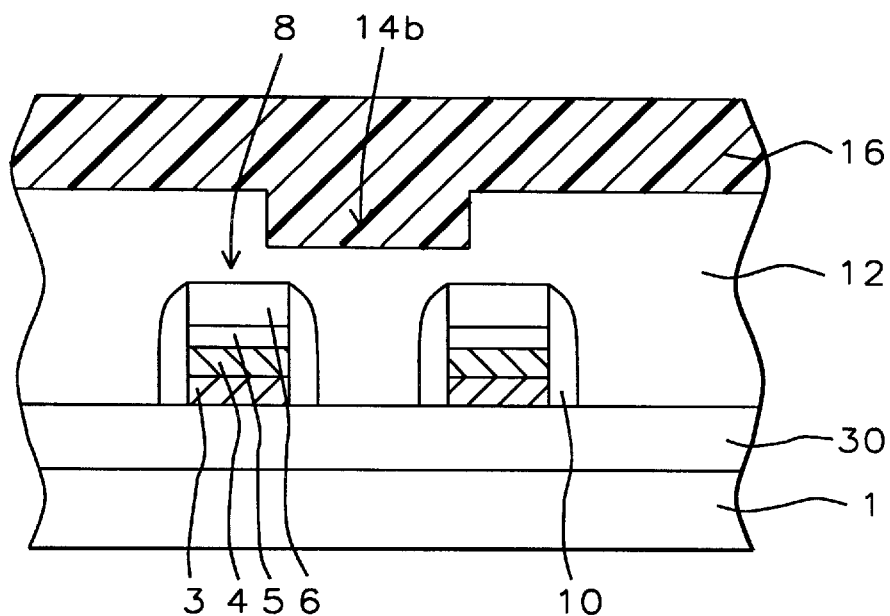
Figure 4D:
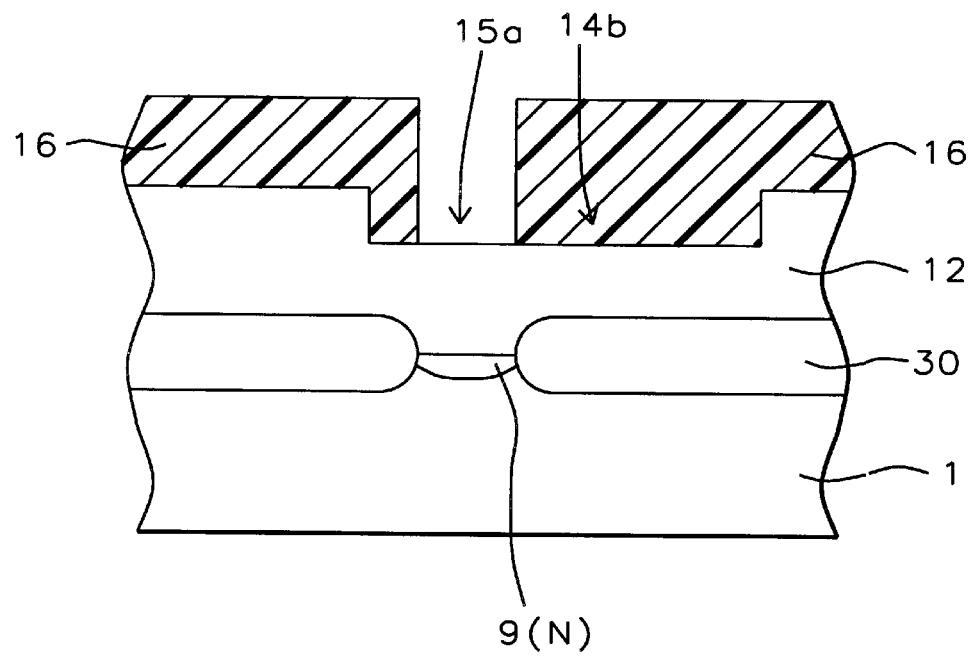

Opening 14a, in first insulator layer 12, is next enlarged using of an isotropic buffered, hydrofluoric, (HF), acid solution, creating opening 14b, shown schematically for the top view, in FIG. 4A, and shown schematically, in cross-sectional style, in FIGS. 4B, 4C, and 4D. The HF procedure results in opening 14b, with an increase in width between about 25 to 50%, compared to opening 14a. The increase in area of opening 14b, which when filled with polysilicon will become the upper polysilicon filled trench shape for the modified polysilicon plug structure, will ease the requirement of landing a subsequent bit line structure on this shape. After removal of second photoresist shape 13, via plasma oxygen ashing and careful wet cleans, a third photoresist shape 16, is applied, featuring narrow opening 15a, between about 2500 to 3500 Angstroms in diameter, exposing the bottom portion of first insulator layer 12, in a region overlying lightly doped source and drain region 9, between polysilicon gate structures 8. Opening 15a, in third photoresist shape 16, is shown schematically in FIGS. 4B and 4D.

Figure 5C:
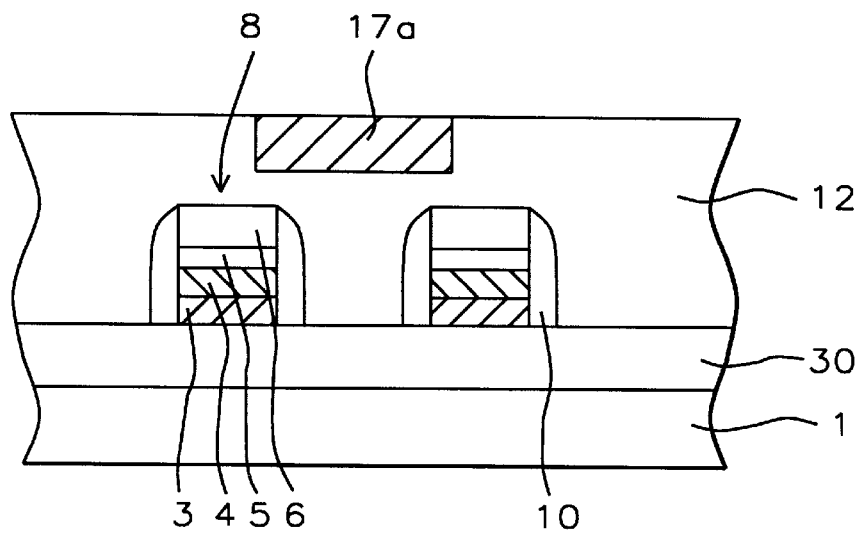

An anisotropic RIE procedure, using $CHF_3$ as an etchant, is used to transfer narrow opening 15a, in third photoresist shape 16, to first insulator layer 12, exposing the top surface of lightly doped source and drain region 9, in the active region of semiconductor substrate 1. This is schematically shown for the top view, in FIG. 5A, and in cross-sectional style in FIG. 5B. After removal of third photoresist shape 16, via plasma oxygen ashing and careful wet cleans, a polysilicon layer, is deposited using LPCVD procedures, to a thickness between about 3000 to 6000 Angstroms, completely filling narrow opening 15a, in the bottom portion of first insulator layer 12, and completely filling the wider opening 14b, in the upper portion of first insulator layer 12. The polysilicon layer is doped either during deposition via an in situ doping procedure, via the addition of either arsine or phosphine, to a silane ambient, or the polysilicon layer can be deposited intrinsically and then doped using ion implantation procedures. An anneal procedure is next employed, to diffuse the heavily doped N type dopants, from the overlying polysilicon layer, into a region of semiconductor substrate 1, creating heavily doped source drain region 11, shown schematically in FIG. 5B. Removal of unwanted portions of the polysilicon layer, overlying the top surface of first insulator layer 12, are removed using either a RIE etch back procedure, using $Cl_2$ as an etchant, or via the use of a chemical mechanical polishing, (CMP), procedure. After removal of unwanted portions of polysilicon, the modified polysilicon plug structure, comprised of an upper polysilicon filled trench shape 17a, in opening 14b, on an underlying polysilicon plug, in narrow opening 15a, is now completed, and shown schematically in FIG. 5B. FIG. 5C, schematically shows the upper polysilicon filled trench shape 17a, again overlying non-active regions of semiconductor substrate 1.

Figure 6A:
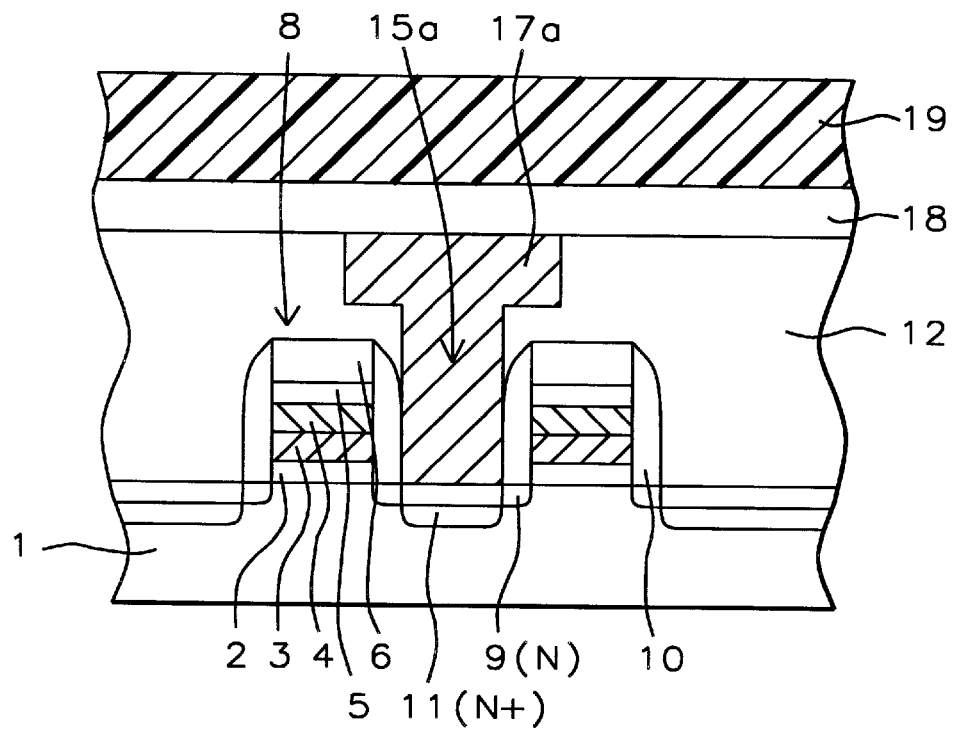
Figure 6B:
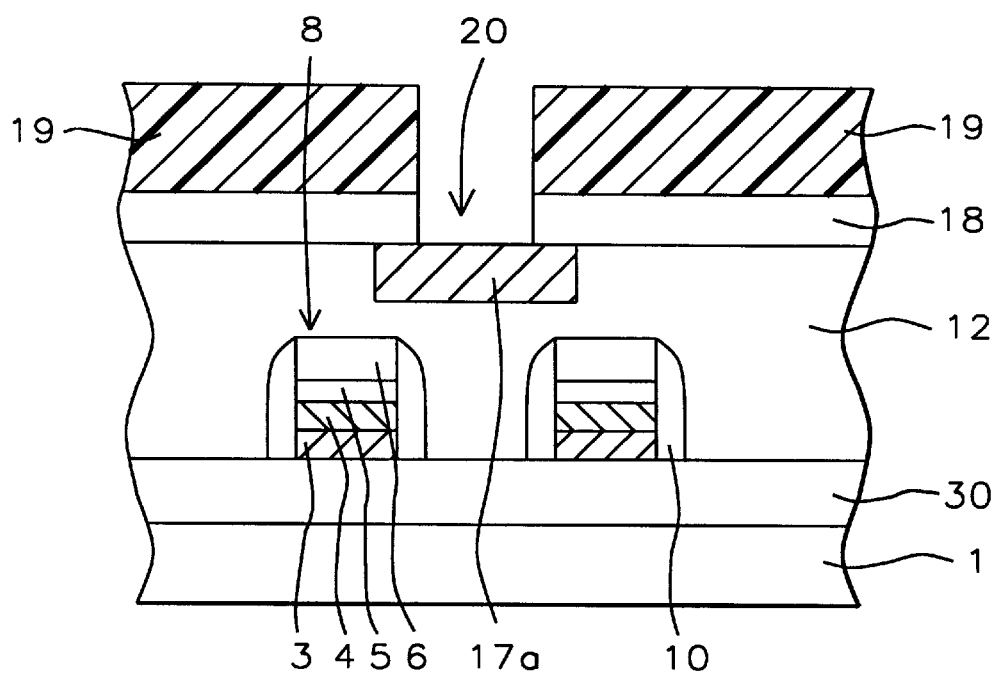
Figure 7A:
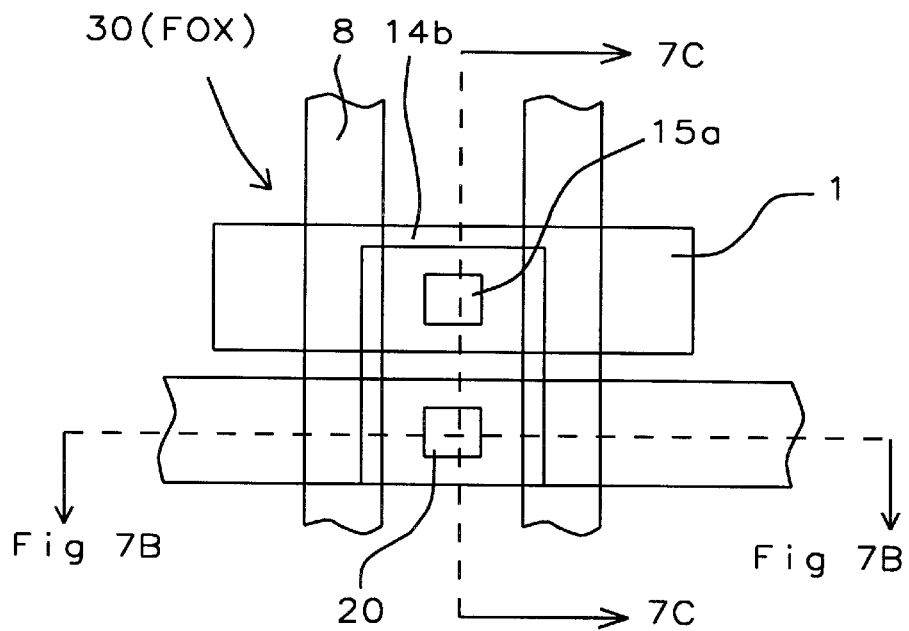

A second insulator layer 18, of silicon oxide, is next deposited using either LPCVD or PECVD procedures, to a thickness between about 1000 to 3000 Angstroms, shown schematically in FIGS. 6A, and 6B. A fourth photoresist shape 19, is applied, and used as a mask to open bit line via hole 20, in second insulator layer 18, exposing the top surface of upper polysilicon filled trench shape 17a, shown schematically in FIG. 6B. Bit line via hole 20, is only opened in a region in which the upper polysilicon filled trench shape 17a, of the modified polysilicon plug structure, extends over a non-active region of semiconductor substrate 1. This is possible as a result of creating, and then enlarging opening 14b, via the isotropic wet etch procedure. Bit line via hole 20, is shown schematically in the top view of FIG. 7A.

Figure 7B:
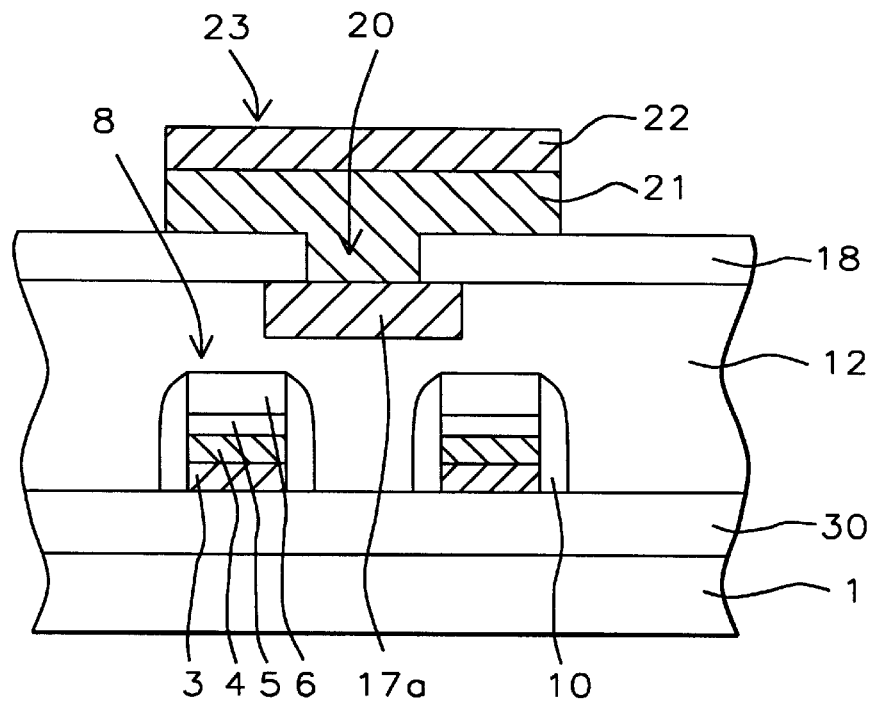
Figure 7C:
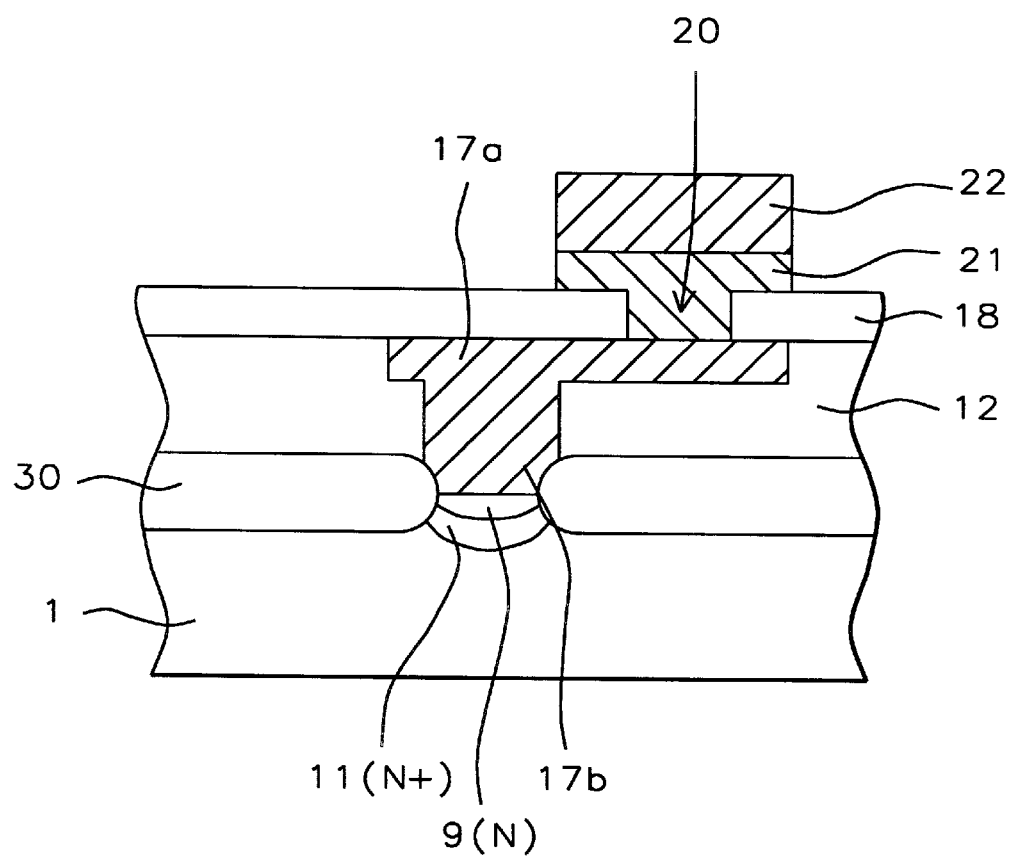

After removal of fourth photoresist shape 19, via plasma oxygen ashing and careful wet cleans, another polysilicon layer 21, is deposited via LPCVD procedures, to a thickness between about 500 to 1000 Angstroms, is deposited, including deposition in bit line via hole 20. Polysilicon layer 21, is again doped either during deposition via an in situ doping procedure, by the addition of either arsine or phosphine, to a silane ambient, or polysilicon layer 21, can be deposited intrinsically and ion implanted with either arsenic or phosphorous ions. A layer of tungsten silicide 22, is next deposited, via LPCVD procedures, to a thickness between about 1000 to 2000 Angstroms. Conventional photolithographic and RIE procedures, using $Cl_2$ as an etchant, are used to create the bit line contact structure 23, comprised of tungsten silicide layer 22, on polysilicon layer 21, schematically shown, in cross-sectional style in FIGS. 7B and 7C. Photoresist removal is once again accomplished using plasma oxygen ashing and careful wet cleans. The top view, shown in FIG. 7A, features the bit line structure 23, contacting the upper polysilicon filled trench shape, of the modified polysilicon plug structure, in enlarged opening 14b, overlying a non-active region of semiconductor substrate 1.

While this invention has been particularly shown and described with reference to the preferred embodiments thereof, it will be understood by those skilled in the art that various changes inform and details may be made without departing from the spirit and scope of this invention.

What is claimed is:

1. A method for fabricating a modified polysilicon plug structure, on a semiconductor substrate, comprising the steps of:
   providing transfer gate transistors, comprised of polysilicon gate structures, on an underlying gate insulator layer, with a lightly doped source and drain region located between the polysilicon gate structures;
   forming a dual shaped opening in said first insulator layer comprised of a lower opening in a bottom portion of said first insulator layer, exposing a portion of said lightly doped source and drain region, and comprised of an upper opening in a top portion of said first insulator layer, with said upper opening comprised of a first upper opening portion, overlying said lower opening, and of a second upper opening portion overlying an non-active device region, and with said lower opening narrower in diameter than said upper opening;
   forming said modified polysilicon plug structure in said dual shaped opening comprised of; a bottom portion of said modified dual shaped polysilicon plug structure located in said lower opening of said dual shaped opening, overlying and contacting said portion of said lightly doped source and drain region; and comprised of an upper portion of said modified polysilicon plug structure, located in said upper opening of said dual shaped opening, with said upper portion of said modified polysilicon plug structure comprised with a first portion, overlying and contacting said bottom portion of said modified polysilicon plug structure, and comprised with a second portion of said upper portion of said modified polysilicon plug structure overlying said non-active device region;
   performing an anneal procedure to create a heavily doped source and drain region, directly underlying said bottom portion of said modified dual shaped polysilicon plug structure;
   forming a bit line via hole in a second insulator layer, exposing a portion of the top surface of said second portion of said upper portion of said modified polysilicon plug structure; and
   forming a bit line structure, with a portion of said bit line structure contacting said portion of top surface of said modified polysilicon plug structure, located in said bit line via hole.

2. The method of claim 1, wherein said first insulator layer is a silicon oxide layer, deposited using LPCVD or PECVD procedures, to a thickness between about 8000 to 10000 Angstroms, followed by a planarization procedure, using chemical mechanical polishing, resulting in a polished, final thickness for said first insulator layer, between about 3000 to 5000 Angstroms.

3. The method of claim 1, wherein said upper opening, of said dual shaped opening, in said top portion of said first insulator layer, is formed to a depth between about 2000 to 4000 Angstroms, in said first insulator layer, via an anisotropic RIE procedure, using $CHF_3$ as an etchant.

4. The method of claim 1, wherein said upper opening, of said dual shaped opening, in said top portion of said first insulator layer, is enlarged via exposure to a buffered hydrofluoric acid solution, increasing the width of said upper opening by between about 25 to 50%.

5. The method of claim 1, wherein said lower opening of said dual shaped opening, in said bottom portion of said first insulator layer, is between about 2500 to 3500 Angstroms in diameter, and formed via an anisotropic RIE procedure, using $CHF_3$ as an etchant.

6. The method of claim 1, wherein said modified polysilicon plug structure is formed from a polysilicon layer, deposited using LPCVD procedures, to a thickness between about 3000 to 6000 Angstroms, and patterned via use a RIE etch back procedure, using $Cl_2$ as an etchant, or via use of a CMP procedure.

7. The method of claim 1, wherein said second insulator layer is a silicon oxide layer, deposited using LPCVD or PECVD procedures, to a thickness between about 1000 to 3000 Angstroms.

8. The method of claim 1, wherein said bit line via hole is opened, in said second insulator layer, via an anisotropic RIE procedure, using $CHF_3$ as an etchant.

9. The method of claim 1, wherein said bit line structure is comprised of an underlying polysilicon shape, formed via deposition of a polysilicon layer, via LPCVD procedures, to a thickness between about 500 to 1000 Angstroms, and comprised of an overlying tungsten silicide shape, formed via deposition of a tungsten silicide layer, via LPCVD procedures, to a thickness between about 1000 to 2000 Angstroms, with patterning of said polysilicon layer and said tungsten silicide layer accomplished via anisotropic RIE procedures, using $Cl_2$ as an etchant.

10. A method for fabricating a modified polysilicon plug structure, for a semiconductor memory device, on a semiconductor substrate, featuring a polysilicon filled, dual shaped opening, in an insulator layer, connecting an overlying bit line structure to an underlying source and drain region of a transfer gate transistor, comprising the steps of:

providing transfer gate transistors, comprised of polysilicon gate structures, on a gate insulator layer, with a lightly doped source and drain region between said polysilicon gate structures;

depositing a first silicon oxide layer;

forming an upper opening for said dual shaped opening, in a top portion of said first silicon oxide layer, with a first portion of said upper opening overlying said lightly doped source and drain region, and with a second portion of said upper openings overlying an non-active device region;

performing an isotropic etch to widen said upper opening in said top portion of said first silicon oxide layer;

forming a narrow opening for said dual shaped opening, in a bottom portion of said first silicon oxide layer, within said first portion of said upper opening of said dual shaped opening, exposing a portion of the top surface of said lightly doped source and drain region;

depositing a first polysilicon layer on the top surface of said first silicon oxide layer, and completely filling said dual shaped opening in said first silicon oxide layer;

doping said first polysilicon layer;

removing portions of said polysilicon layer from the top surface of said first silicon oxide layer forming a bottom polysilicon shape in said narrow opening of said dual shaped opening, and forming an upper polysilicon shape in said upper opening of said dual shaped opening, with said upper polysilicon shape comprised of a first portion, overlying and contacting said bottom polysilicon shape, and comprised of a second portion overlying said non-active device region;

performing an anneal procedure to form a heavily doped source and drain region, in a portion of said lightly doped source and drain region located directly underlying said bottom polysilicon shape;

depositing a second silicon oxide layer;

opening a bit line via hole in said second silicon oxide layer, exposing a portion of the top surface of said second portion of said upper polysilicon shape;

depositing a second polysilicon layer on the top surface of said second silicon oxide layer, and in said bit line via hole;

depositing a metal silicide layer; and patterning of said metal silicide layer, and of said second polysilicon layer, to create said bit line structure, contacting said portion of top surface of said upper polysilicon shape, in said bit line via hole.

11. The method of claim 10, wherein said first silicon oxide layer is deposited using LPCVD or PECVD procedures, to a thickness between about 8000 to 10000 Angstroms, followed by a planarization procedure, using a CMP process, resulting in a polished, final thickness, for said first silicon oxide layer, between about 3000 to 5000 Angstroms.

12. The method of claim 10, wherein said upper opening, in said dual shaped opening, is created in said top portion of said first silicon oxide layer, to a depth between about 2000 to 4000 Angstroms, via an anisotropic RIE procedure, using $CHF_3$ as an etchant.

13. The method of claim 10, wherein said upper opening, in said dual shaped opening, is widened by between about 25 to 50%, via use of an isotropic wet etch procedure, using a buffered hydrofluoric acid solution.

14. The method of claim 10, wherein said narrow opening, in said dual shaped opening, is formed in said bottom portion of said first silicon oxide layer, with a diameter between about 2500 to 3500 Angstroms, via an anisotropic RIE procedure, using $CHF_3$ as an etchant.

15. The method of claim 10, wherein said first polysilicon layer is deposited using LPCVD procedures, to a thickness between about 3000 to 6000 Angstroms.

16. The method of claim 10, wherein said modified polysilicon plug structure is formed via removal of said first polysilicon layer, from said top surface of said first silicon oxide layer, via an anisotropic RIE procedure, using $Cl_2$ as an etchant.

17. The method of claim 10, wherein said modified polysilicon plug structure is formed via removal of said first polysilicon layer, from said top surface of said first silicon oxide layer, via a CMP procedure.

18. The method of claim 10, wherein said second silicon oxide layer is deposited using LPCVD or PECVD procedures, to a thickness between about 1000 to 3000 Angstroms.

19. The method of claim 10, wherein said second polysilicon layer is deposited using LPCVD procedures, to a thickness between about 500 to 1000 Angstroms.

20. The method of claim 10, wherein said metal silicide layer is tungsten silicide, deposited using LPCVD procedures, to a thickness between about 1000 to 2000 Angstroms.

21. The method of claim 10, wherein said bit line structure is formed via an anisotropic RIE procedure, using $Cl_2$ as an etchant for said metal silicide layer, and for said second polysilicon layer.

* * * * *